(12) United States Patent
Inoue et al.

(10) Patent No.: US 7,205,861 B2
(45) Date of Patent: Apr. 17, 2007

(54) BALUN DEVICE (75) Inventors: Makoto Inoue, Gunma (JP); Satoshi Watanabe, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/004,310

(22) Filed: Dec. 2, 2004

(65) Prior Publication Data
US 2005/0168300 A1   Aug. 4, 2005

(30) Foreign Application Priority Data
Dec. 5, 2003 (JP) .............................. 2003-407680
Sep. 24, 2004 (JP) .............................. 2004-277894

(51) Int. Cl.
*H03H 7/42* (2006.01)
*H01P 5/10* (2006.01)

(52) U.S. Cl. .......................... 333/25; 333/26; 333/202

(58) Field of Classification Search ................ 333/25, 333/26, 202; 336/200; 455/83
See application file for complete search history.

(56) References Cited

U.S. PATENT DOCUMENTS

| | | | |
|---|---|---|---|
| 6,606,015 B2 * | 8/2003 | Uriu et al. ................... 333/132 |
| 6,628,189 B2 * | 9/2003 | Yazaki et al. ................ 336/200 |
| 6,788,164 B2 * | 9/2004 | Maekawa et al. ............. 333/26 |
| 6,937,845 B2 * | 8/2005 | Watanabe et al. ............. 455/83 |
| 6,952,142 B2 * | 10/2005 | Guitton et al. ................ 333/25 |

FOREIGN PATENT DOCUMENTS

| JP | 2002-271036 A | 3/2001 |
|---|---|---|
| JP | 2002-43882 A | 2/2002 |

* cited by examiner

*Primary Examiner*—Dean Takaoka
(74) *Attorney, Agent, or Firm*—Knobbe Martens Olson & Bear LLP (57) ABSTRACT

A balun device provides a more suitable technique for a broader band application which has been difficult for conventional baluns. The balun device has a balun unit, which is provided with a balanced line and an unbalanced line, and a matching circuit connected to the unbalanced line, wherein the matching circuit is composed of a high-pass filter.

10 Claims, 15 Drawing Sheets

LC VALUE SMALLER THAN THAT DESIGNED BASED ON THE APPLIED CENTER FREQUENCY

UNBALANCED TERMINAL

BALANCED SIGNAL

BALANCED SIGNAL

BALANCED SIGNAL

BALANCED SIGNAL

BALANCED SIGNAL

PRIOR ART

FIG. 23

PRIOR ART

US 7,205,861 B2

BALUN DEVICE

BACKGROUND OF THE INVENTION

1. Field of the Invention

The present invention relates to a balun (balanced-to-unbalanced transformer) that connects a balanced circuit and an unbalanced circuit together, for example, for transforming the impedance of transmission lines in a high frequency of UHF band or higher.

2. Description of the Related Art

Figure 22:
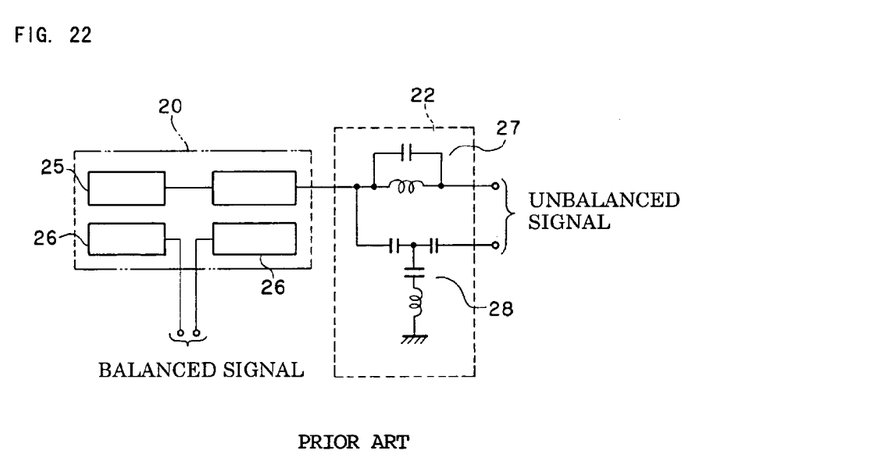
FIG. 22 is a circuit diagram showing a configuration of an example of the conventional balun.

As a conventional balun, a technique disclosed in JP-A-2002-43882 is known. In the balun disclosed in this document, a band-pass filter is connected to the terminal of an unbalanced line of the balun. As an alternative example, a technique disclosed in JP-A-2002-271036 is known. The circuit of this technique is provided, as shown in FIG. 22, with a balun 20 which is composed of an unbalanced transmission line 25 and a pair of balanced transmission lines 26, a second-order low-pass filter 27 which is composed of an L and a C connected to the unbalanced transmission line, and a matching circuit 22 of diplexer which is composed of a third-order high-pass filter 28 that is composed of an L and three Cs.

Figure 23:
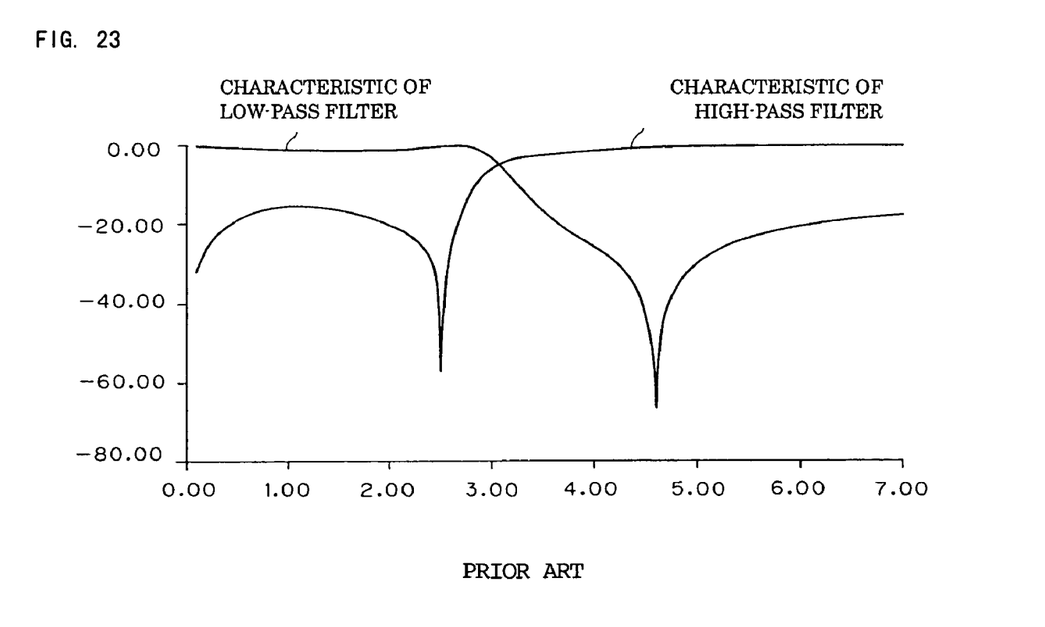
FIG. 23 is a characteristic graph of the above.

In the conventional balun disclosed in JP-A-2002-43882, since a band-pass filter is connected, it is difficult to make the band broader. Also, in the matching circuit 22 of diplexer disclosed in JP-A-2002-217036, since passing bands of the low-pass filter 27 and the high-pass filter 28 are generally designed not to overlap each other, the lower band side of the balun 20 becomes a stopping band to the high-pass filter 28 and the higher band side of the balun becomes a stopping band to the low-pass filter 27, therefore, it is unsuitable to make the band broader, similarly to JP-A-2002-43882 (See FIG. 23).

Furthermore, in recent years, ultra wide band communication equipment (e.g. mobile phone and wireless LAN) is getting attention, and its standard desires that such equipment transmits an ultra wide band of about 3 GHz to 10 GHz with a flat characteristic. Accordingly, to realize an ultra wide band filter or balun, the band must be made broader than that used before. It causes another problem, however, that such a filter or balun tends to become larger in size if the ultra wide band is designed by a commonly known method. Therefore, it is unsuitable as a device expected to be built in equipment, such as mobile phones, that are required to be microminiaturized.

SUMMARY OF THE INVENTION

Various aspects of the present invention provide a balun in which the ultra wide band can be realized and the size can be miniaturized.

The first aspect of the invention comprises a balun unit, comprising a balanced line and an unbalanced line, and a high-pass filtering matching circuit connected to the unbalanced line, balanced line, or both.

The second aspect of the invention is configured similarly to the first aspect, wherein the high-pass filtering matching circuit comprises a capacitor connected in series to either the unbalanced line or the balanced lien, and an inductor connected in parallel to the unbalanced line, and wherein the capacitor is connected at a side closer to the balun unit than the inductor is.

The third aspect of the invention comprises a balun unit provided with a balanced line and an unbalanced line, and a matching circuit connected to the unbalanced line, wherein length of a strip line in the balun unit is made shorter than a fundamental length $\lambda/4$ to shift a center frequency to a higher band side, and the shifted portion is compensated with an expansion to a lower band side by inserting the matching circuit, so that the balun device as a whole has an ultra wide band and is miniaturized.

The fourth aspect of the invention comprises a balun unit provided with a balanced line and an unbalanced line, and a matching circuit connected to the unbalanced line, wherein the balun unit is composed of a capacitor and an inductor element that give a resonant frequency lower than a capacitor and an inductance giving a resonant frequency coincided with an applied center frequency, to shift a center frequency to a higher band side, and the shifted portion is compensated with an expansion to a lower band side by inserting the matching circuit, so that the balun device as a whole has an ultra wide band and is miniaturized.

The fifth aspect of the invention comprises a balun unit provided with a balanced line and an unbalanced line, and a matching circuit connected to the unbalanced line, wherein the matching circuit has an improved reflective property compared to the balun unit, in vicinity of cut-off frequency at a lower band side of a used band.

The sixth aspect of the invention comprises a balun unit provided with a balanced line and an unbalanced line, and a matching circuit connected to the balanced line, wherein the length of a strip line in the balun unit is made shorter than a fundamental length $\lambda/4$ to shift a center frequency to a higher band side, and the shifted portion is compensated with an expansion to lower band side by inserting the matching circuit, so that the balun device as a whole has an ultra wide band and is miniaturized.

The seventh aspect of the invention comprises a balun unit provided with a balanced line and an unbalanced line, and a matching circuit connected to the balanced line, wherein the balun unit is composed of a capacitor and an inductor element that give a resonant frequency lower than a capacitor and an inductance giving a resonant frequency coincided with an applied center frequency, to shift a center frequency to a higher band side, and the shifted portion is compensated with an expansion to a lower band side by inserting the matching circuit, so that the balun device as a whole has an ultra wide band and is miniaturized.

The eighth aspect of the invention comprises a balun unit provided with a balanced line and an unbalanced line, and a matching circuit connected to the balanced line, wherein the matching circuit has an improved reflective property compared to the balun unit, in vicinity of cut-off frequency at a lower band side of a used band.

When the matching circuit connected to the unbalanced line of the balun is composed of a high-pass filter, the lower band is expanded and the balun device can perform the ultra-wide band characteristic.

In one embodiment, by the configuration that the high-pass filter comprises a capacitor connected in series to the unbalanced line and an inductor connected in parallel to the unbalanced line, wherein the capacitor is connected at a side closer to the balun unit than the inductor is, the frequency characteristic at a lower band is improved.

In another embodiment, with the configuration that the length of a strip line in the balun unit is made shorter than a fundamental length $\lambda/4$, or with the configuration that the balun unit is composed of a capacitor and an inductor element, which give a resonant frequency lower than when it is composed of a capacitor and an inductance giving a resonant frequency coincided with an applied center frequency, to shift a center frequency to a higher band side, and that the shifted portion is compensated with an expansion to a lower band side by inserting the matching circuit, the balun can perform the ultra-wide band characteristic and be miniaturized.

In another embodiment, with the configuration that the matching circuit has an improved reflective property compared to the balun unit, in vicinity of cut-off frequency at a lower band side of a used band, the expansion of a lower band side can be achieved. In this case, the term "used band" means the frequency band that is used in the communication equipment into which the balun according to embodiments of the present invention is built, for example, the frequency band is 3 GHz to 10 GHz as mentioned above, and in that case, the "cut-off frequency at a lower band side" is 3 GHz.

In still another embodiment, with the configuration that the length of a strip line in the balun unit is made shorter than a fundamental length $\lambda/4$ to shift a center frequency to a higher band side, and that the shifted portion is compensated with an expansion to a lower band side by inserting the matching circuit, the balun device as a whole has an ultra wide band and the size of the balun itself can be miniaturized.

BRIEF DESCRIPTION OF THE DRAWINGS

FIGS. 20A and 20B are circuit diagrams showing configurations of the balun according to Example 5: FIG. 20A is the case the matching circuit is composed of high-pass filters; and FIG. 20B is the case the matching circuit is composed of capacitors alone.

DESCRIPTION OF THE PREFERRED EMBODIMENTS

One embodiment of the present invention comprises a balun unit provided with a balanced line and an unbalanced line, and a matching circuit connected to the balanced line, wherein the length of a strip line in the balun unit is made shorter than a fundamental length $\lambda/4$ to shift a center frequency to a higher band side, and the shifted portion is compensated with an expansion to a lower band side by inserting the matching circuit, so that the balun device as a whole has an ultra wide band and is miniaturized.

EXAMPLE 1

Now, Example 1 of balun according to one embodiment of the present invention will be described below referring to FIGS. 1–5.

Figure 1:
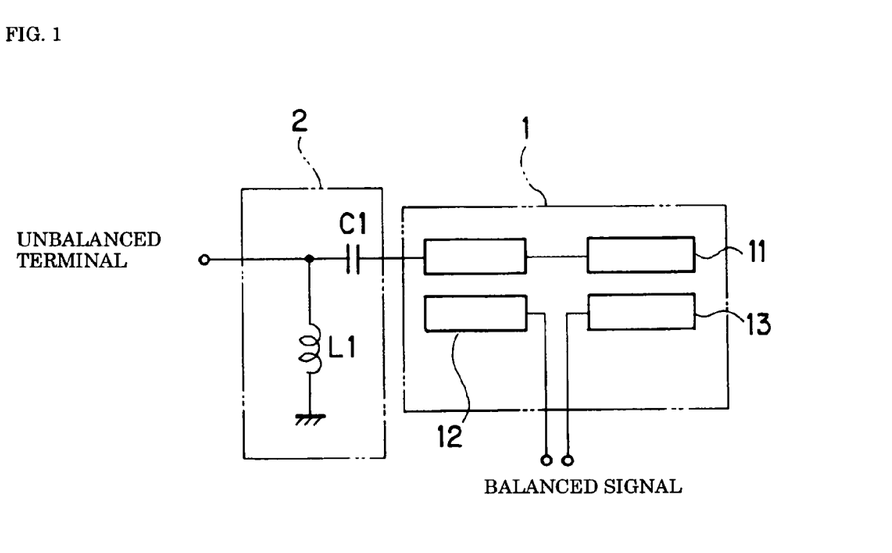
FIG. 1 is a circuit diagram showing a configuration of the balun according to one embodiment of the present invention.

FIG. 1 is a circuit diagram of the balun showing Example 1, in which the unit numbered 1 shows a balun unit having an unbalanced line 11 and two balanced lines 12, 13, and the unit numbered 2 shows a matching circuit in the form of a high-pass filter, which is composed of a capacitor C1 connected to the unbalanced line and an inductor L1, the capacitor C1 in the matching circuit 2 being connected in series to the unbalanced line 11 and the inductor L1 being connected in parallel to the unbalanced line 11 through the capacitor C1.

Figure 2:
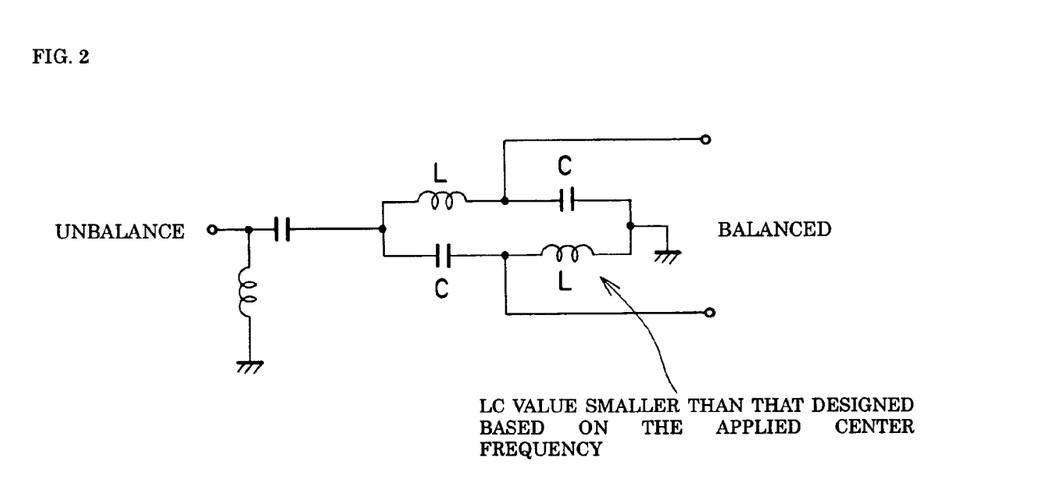
FIG. 2 is a circuit diagram showing the balun unit of the above configuration.

When the balun unit 1 is composed of strip lines, the length of a strip line in the balun unit is made shorter than $\lambda/4$ of the applied center frequency (the center frequency defined in the communications standard), while, when the balun unit 1 is composed of an LC element the LC circuit is configured so as to give a smaller value than the LC value generating the center frequency coincided with the applied center frequency (See FIG. 2).

Figure 3:
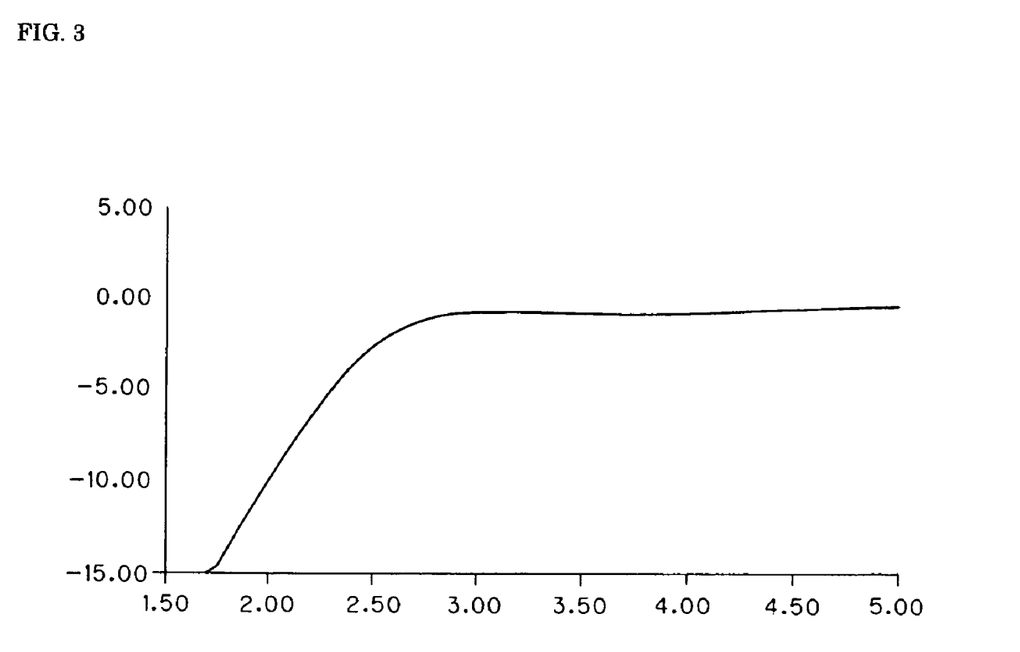
FIG. 3 is a frequency characteristic graph.

In the balun configured as above according to one embodiment of the present invention, the capacitor C1 is connected in series to the balun unit 1 and the inductor L1 is connected in parallel to the unbalanced line 11 via the capacitor C1 so that the lower band side is expanded as shown in FIG. 3.

Figure 4:
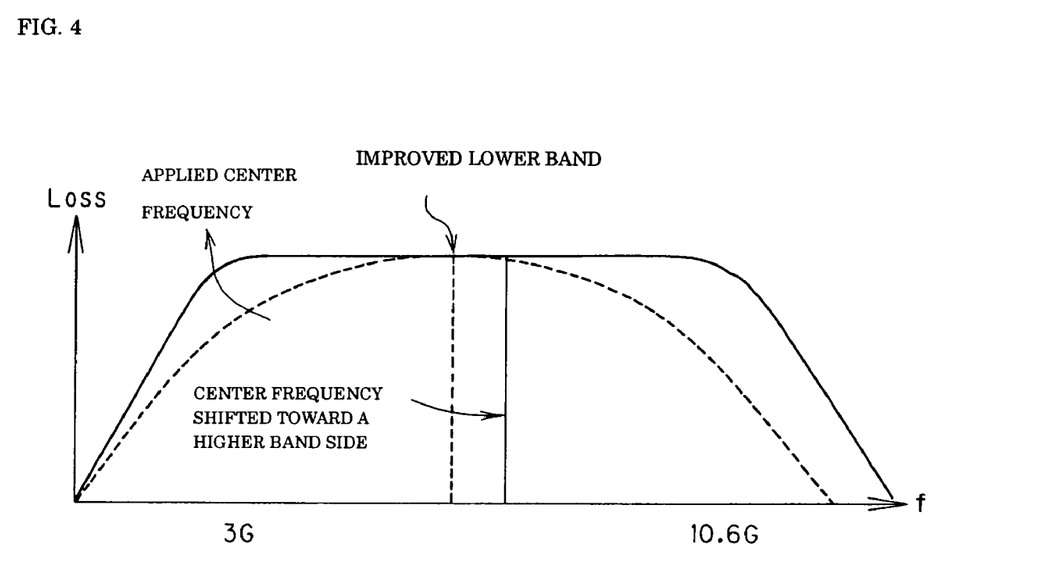
FIG. 4 is a characteristic graph showing that the center frequency shifted to a higher band side from the applied center frequency.

Next, the approach to the above-mentioned band expansion will be described. As shown in FIG. 4, the portion of the center frequency shifted to a higher band side is compensated by the matching circuit 2 composed of a high-pass filter, and it as a whole enables the balun device to provide an ultra wide band.

Figure 5:
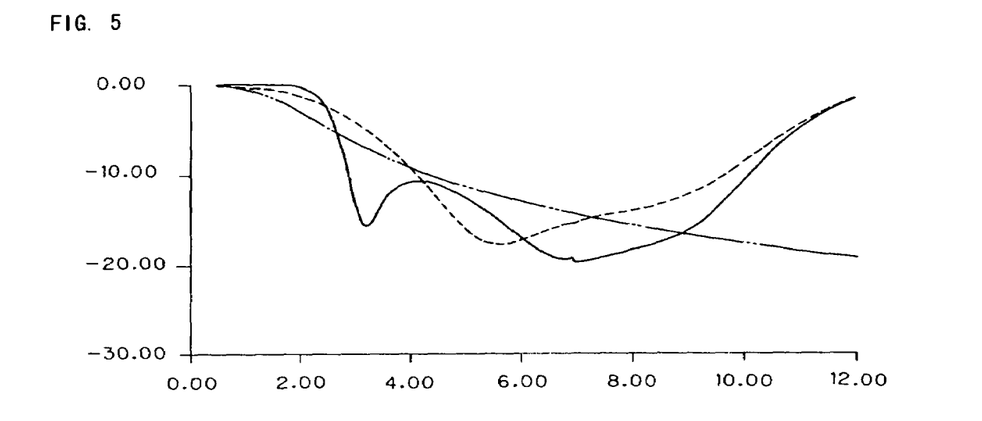
FIG. 5 is a characteristic graph comparing the reflection losses.

Furthermore, by connecting the high-pass filter composing a matching circuit 2, in which the capacitor C1 is connected in series to the balun unit 1, and the inductor L1 is connected in parallel to the unbalanced line 11 through the capacitor C1, as in one embodiment of the present invention, a better reflection loss is obtained than in the case of the balun alone, in vicinity of the cut-off frequency at a lower band side as shown in FIG. 5, i.e. the lower band side is improved. In the figure, the dotted line indicates the reflection loss of the balun alone; the two-dot chain line indicates the reflection loss of the high-pass filter; and the solid line indicates the combined reflection loss thereof.

EXAMPLE 2

Figure 6:
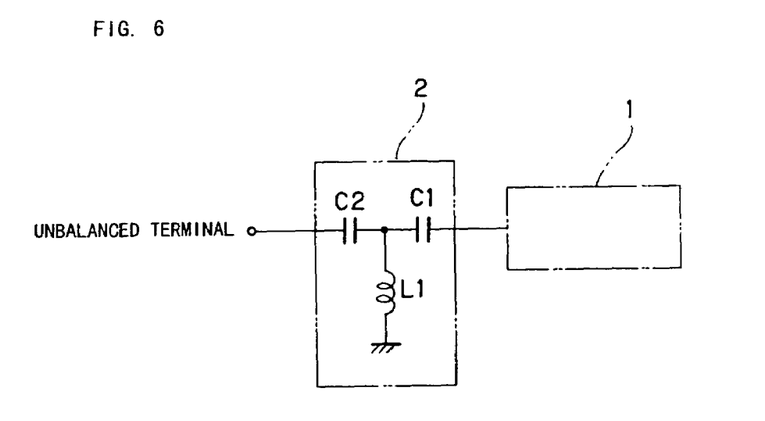
FIG. 6 is a circuit diagram showing a configuration of the balun according to Example 2.
Figure 7:
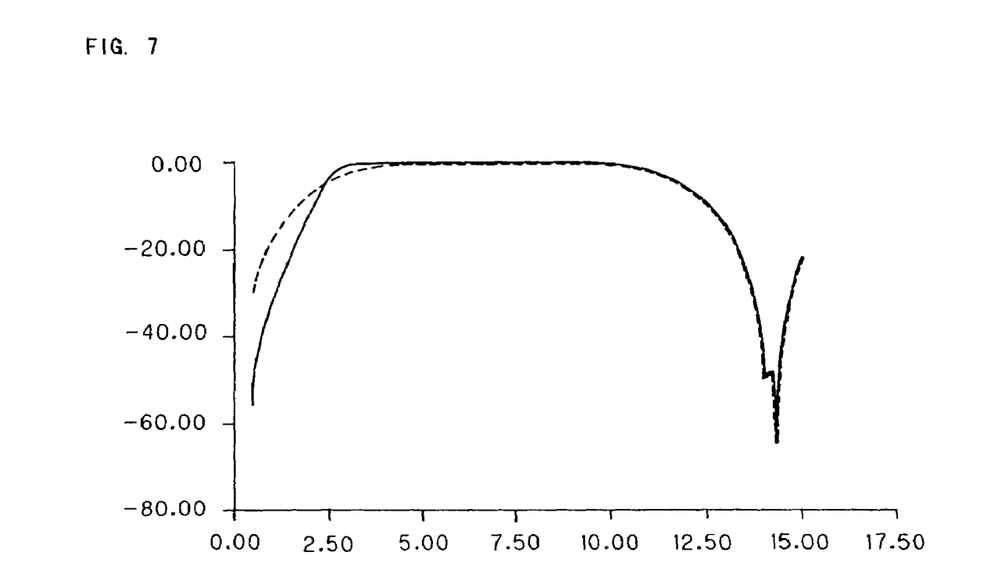
FIG. 7 is a characteristic graph comparing the case without the matching circuit connected and the case with the matching circuit connected according to one embodiment of the invention.

In Example 2, the matching circuit 2 is composed of two capacitors C1, C2, which are connected in series to the unbalanced line 11 as shown in FIG. 6, and an inductor L1 which is connected to the joining point between the two capacitors C1, C2, and it provides the improved ultra wide band characteristic that is nearly the same as in the above-described Example 1 (See FIG. 7).

Here, in the figure, dotted line indicates the property without the matching circuit 2; and solid line indicates the property with the matching circuit 2 connected. The same indication will be used hereinafter.

EXAMPLE 3

Figure 8:
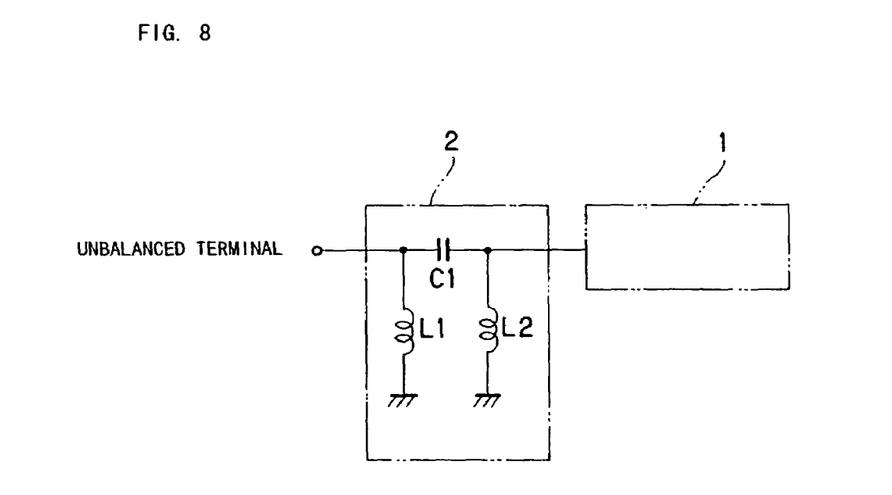
FIG. 8 is a circuit diagram showing a configuration of the balun according to Example 3.
Figure 9:
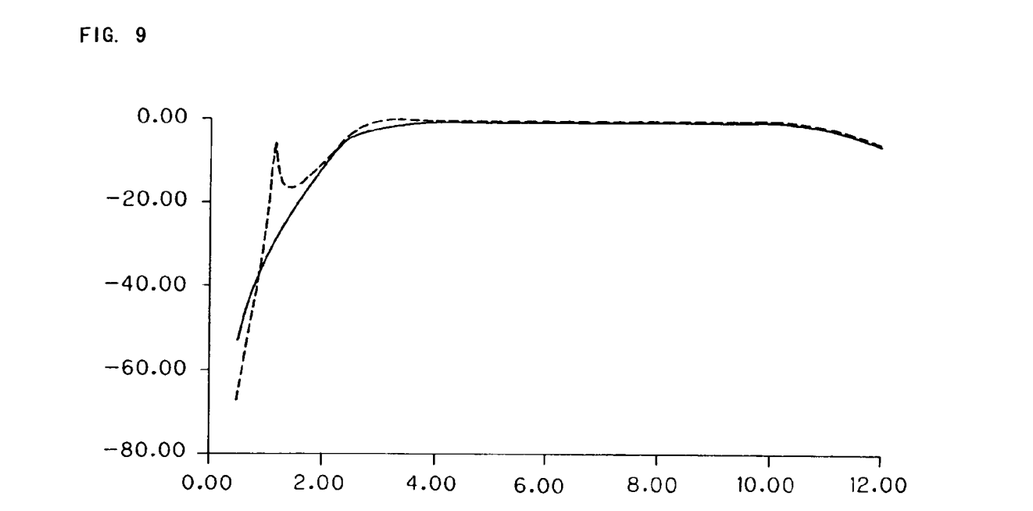
FIG. 9 is a characteristic graph comparing the case without the matching circuit connected and the case with the matching circuit connected according to one embodiment of the invention.
Figure 10:
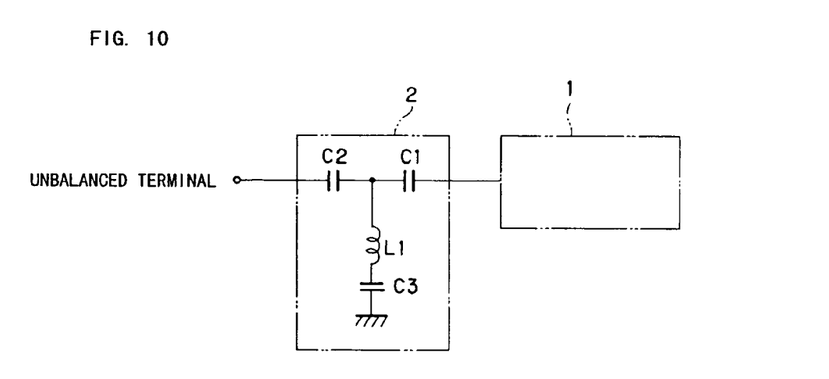
FIG. 10 is a circuit diagram showing a configuration of the balun according to Example 4.

In Example 3, the matching circuit 2 is composed of a capacitor C1 which is connected in series to the unbalanced line 11 as shown in FIG. 8, and two inductors L1, L2 which are connected to both ends of the capacitor C1. Although the result shows an abnormal waveform partially at lower frequency, its ultra wide band is still secured (See FIG. 9).

EXAMPLE 4

Figure 11:
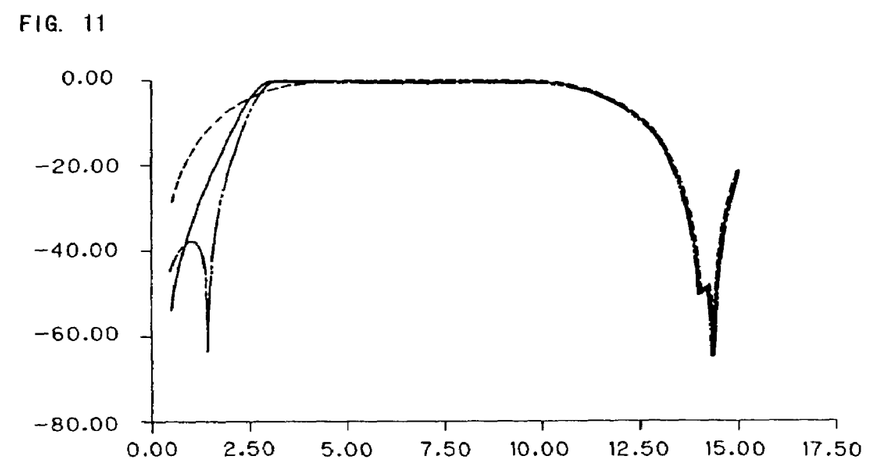
FIG. 11 is a characteristic graph comparing the case without the matching circuit connected and the case with the matching circuit connected according to one embodiment of the invention.

In Example 4, the matching circuit 2 is the same as that of Example 2 except that a capacitor C3 is inserted in series between the inductor L1 and the ground. Differently from the result of Example 2, obtained characteristic of an ultra wide band is flat even at the lower frequency (See FIG. 11).

Now, referential examples will be described below for clarifying the preferred embodiments of the present invention.

(Reference 1)

Figure 12:
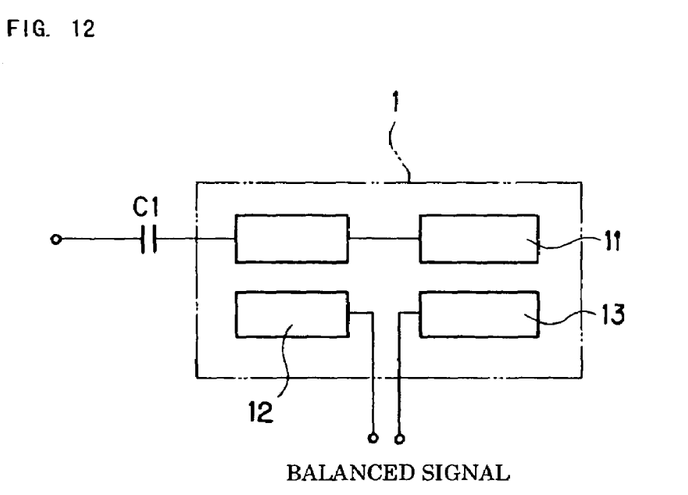
FIG. 12 is a circuit diagram showing a configuration of the balun according to Reference 1.
Figure 13:
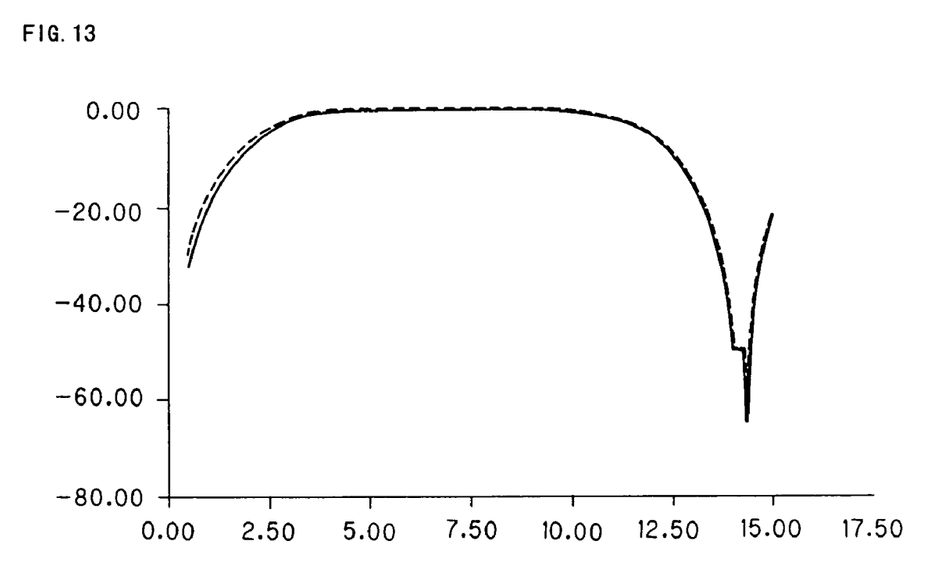
FIG. 13 is a characteristic graph comparing the case of the above circuit and the case without the matching circuit connected.

In Reference 1 shown in FIG. 12, the matching circuit 2 is composed of only a capacitor C1 connected to the unbalanced line 11. Since the capacitor C1 shows a low impedance at a high frequency, it gives the same waveform as that of the case without a matching circuit (indicated by a dashed line) as shown in FIG. 13, therefore it means nothing but a mere wiring and does not have an advantage of connecting the capacitor.

(Reference 2)

Figure 14:
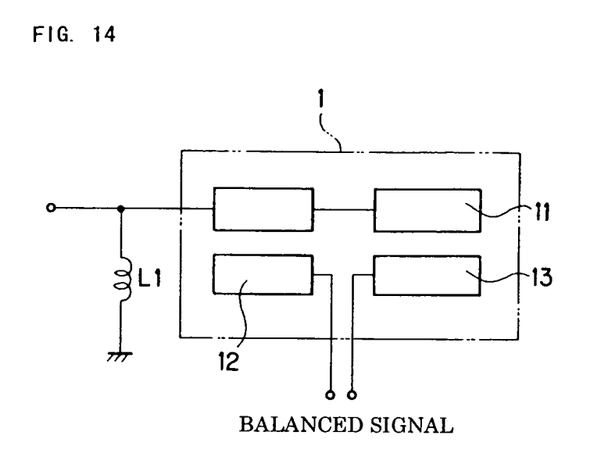
FIG. 14 is a circuit diagram showing a configuration of the balun according to Reference 2.
Figure 15:
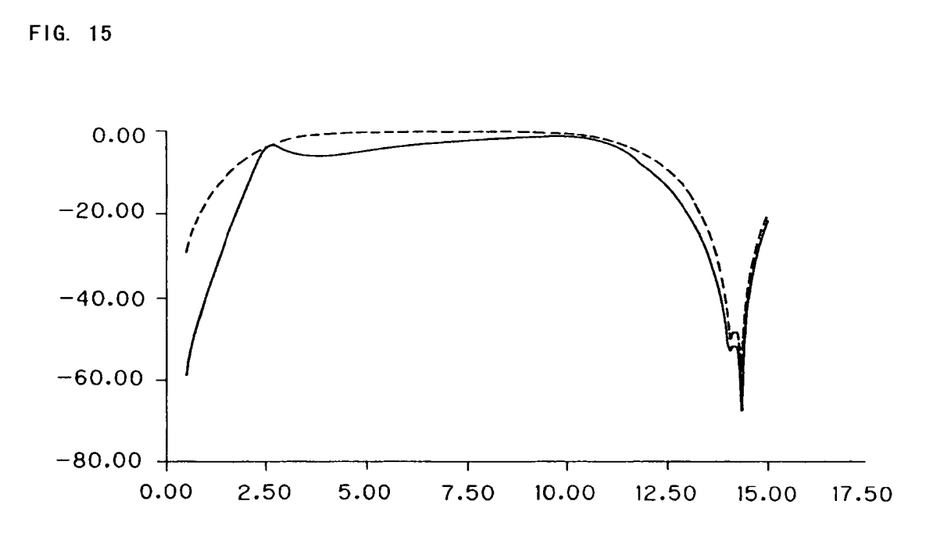
FIG. 15 is a characteristic graph comparing the case of the above circuit and the case without the matching circuit connected.

In Reference 2 shown in FIG. 14, the matching circuit 2 is composed of only an inductor L1 connected to the unbalanced line 11. Since the inductor L1 shows a high impedance information, producing a state where the inductor L1 is disconnected, it gives substantially the same waveform as that of the case without a matching circuit (indicated by a dashed line) as shown in FIG. 15, therefore it does not have an advantage as a matching circuit.

(Reference 3)

Figure 16:
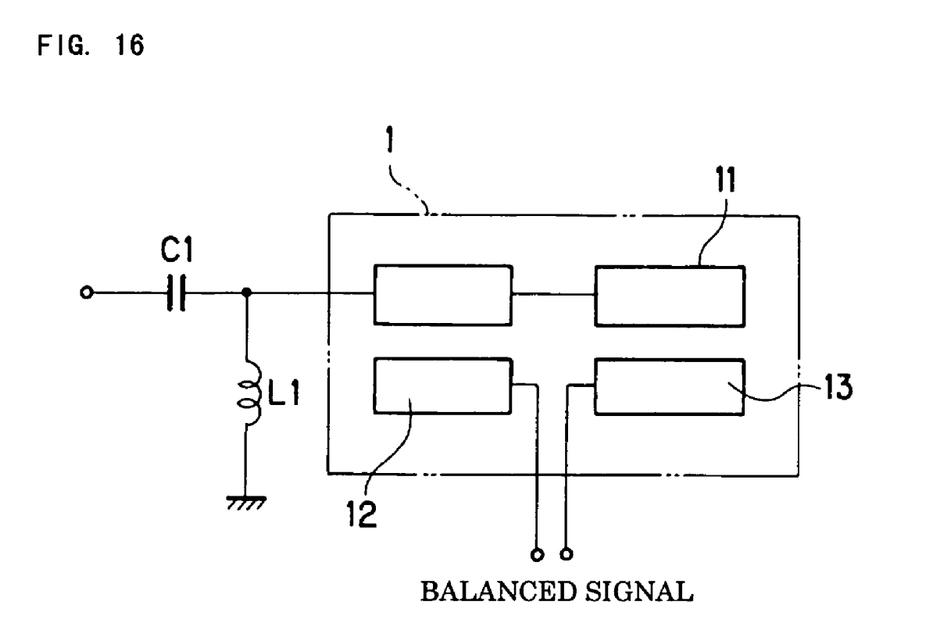
FIG. 16 is a circuit diagram showing a configuration of the balun according to Reference 3.
Figure 17:
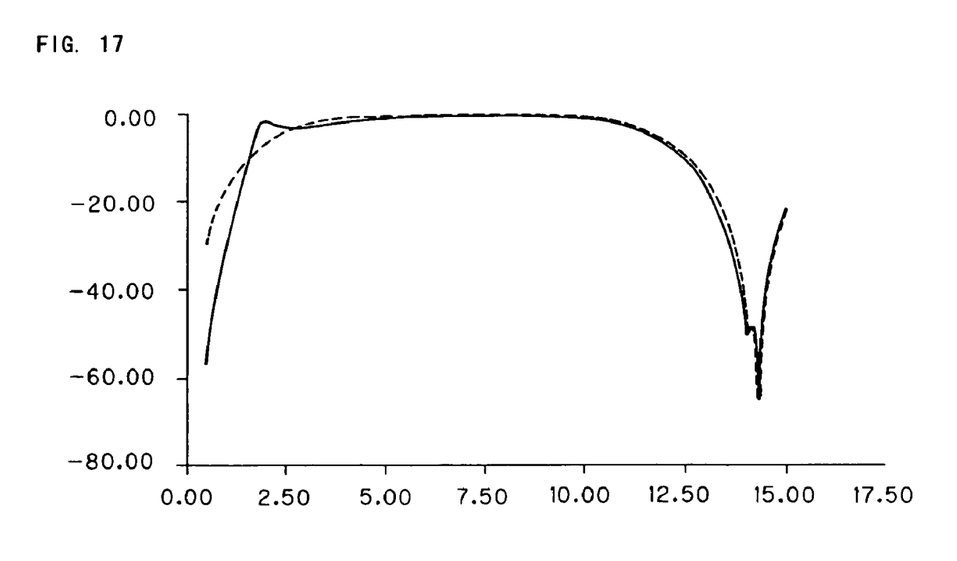
FIG. 17 is a characteristic graph comparing the case of the above circuit and the case without the matching circuit connected.

In Reference 3 shown in FIG. 16, the matching circuit 2 is composed of a capacitor C1 which is connected in series to the unbalanced line 11, and an inductor L1 which is connected in parallel close to the balun unit 1. Compared with the waveform of the case without a matching circuit (indicated by a dash line), it gives a waveform that descends at a lower band side and then raises only slightly its level, as shown in FIG. 17, therefore it does not have an advantage as a matching circuit.

(Reference 4)

Figure 18:
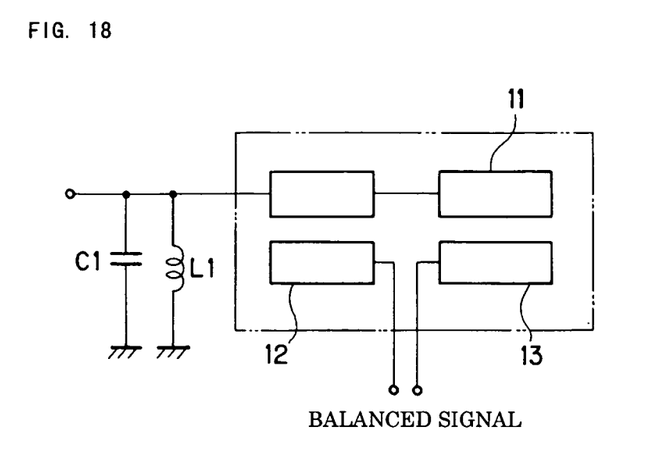
FIG. 18 is a circuit diagram showing a configuration of the balun according to Reference 4.
Figure 19:
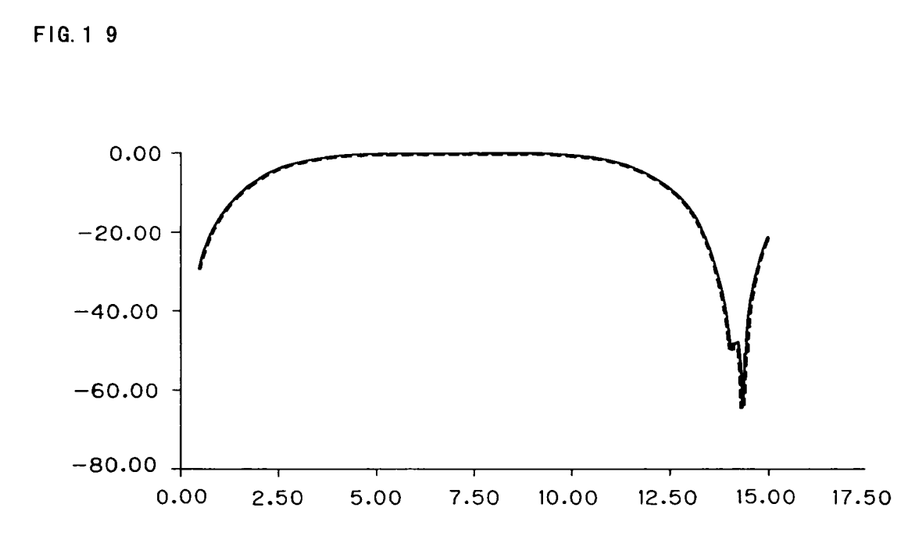
FIG. 19 is a characteristic graph comparing the case of the above circuit and the case without the matching circuit connected.

In Reference 4 shown in FIG. 18, the matching circuit 2 is composed of a capacitor C1 and an inductor L1 connected together in parallel, and is connected to the unbalanced line 11. It gives the same waveform as that of the case without a matching circuit (indicated by a dashed line) as shown in FIG. 19, therefore it does not have an advantage as a matching circuit.

As described above, considering respective referential examples, it is clear that, when the matching circuit 2 configured according to one embodiment of the present invention is connected to the balun unit 1, an ultra wide band and miniaturization can be achieved.

EXAMPLE 5

Figure 20:
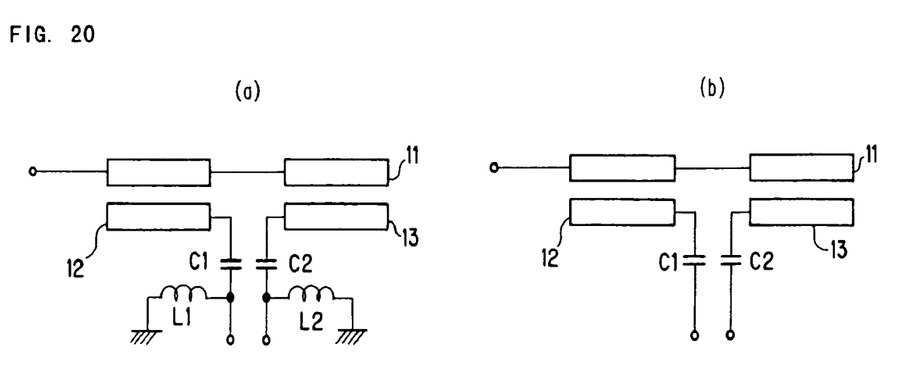

As opposed to the cases of Examples 1–4 in which the matching circuits 2 are connected to the unbalanced line 11 of the balun unit 1, the matching circuit 2 in this Example 5 is configured as a high-pass filter composed of two capacitors C1, C2 which are connected in series to respective input/output terminals of balanced signals in the balanced lines 12, 13, and two inductors L1, L2 which are inserted between respective capacitors C1, C2 and the ground, as shown in FIG. 20A.

The above-shown FIG. 20A is the matching circuit 2 that is a high-pass filter, while FIG. 20B is the matching circuit in which two capacitors C1, C2 are connected to respective input/output terminals for balanced outputs.

In the case of the split-line type, thus configured circuit 2 enables the resonator to be shorter than λ/4, while in the case of the LC type, a smaller LC constant can be selected. Consequently, the property in which the center frequency is shifted to the higher band side and the lower band side is expanded can be obtained, similarly to the curve shown in FIG. 4.

Figure 21:
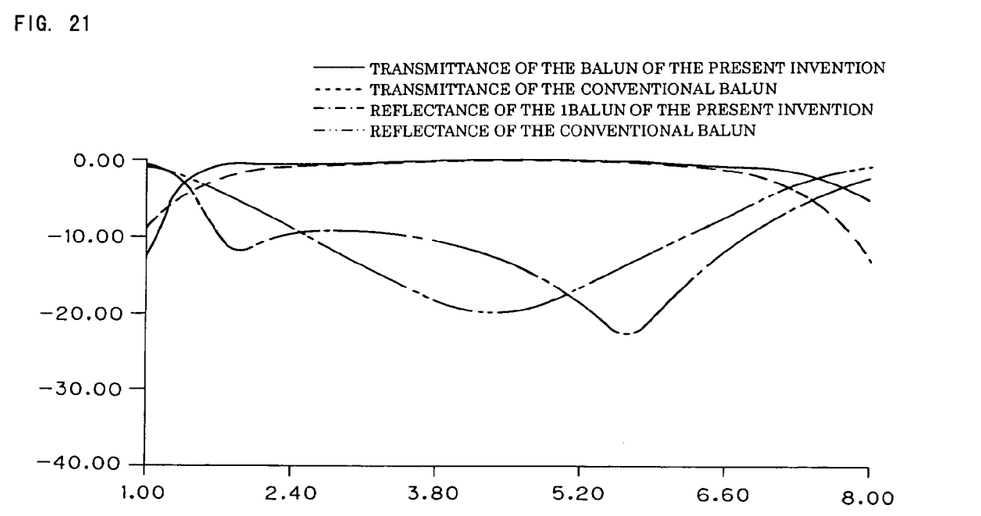
FIG. 21 is a characteristic graph of Example 5.

That is, as shown in FIG. 21, by the configuration in which the above-described matching circuit 2 is connected to the balanced lines 12, 13, the properties of those examples (indicated by a solid line and a dashed line) are improved in the expansion of transmitting band and the reflective property at the lower band side, and, since the resonator can be made shorter at the higher band side, the properties are also improved in the expansion at the higher frequency band, compared with the properties of the conventional balun (indicated by one-dot and two-dot chain lines). Consequently, it is possible as a whole to design with a higher resonant point, taking an advantage of the expansion of transmitting band and that at lower band. As the result, the resonator can be made shorter, therefore the balun device can be miniaturized. In some embodiments, high-pass filtering can be utilized on both the unbalanced and balanced lines.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A method of improving performance and size characteristic of a balun device, the method comprising:
   shifting a resonant frequency of the balun device; and
   high-pass filtering a balanced line or an unbalanced line of the balun device,
   wherein the shifting further comprises shifting a center frequency to higher band side.

2. The method of claim 1, wherein the filtering further comprises compensating the shifted portion with an expansion to lower band side.

3. A balun device, comprising:
   a balun portion comprising a balanced line and an unbalanced line; and
   a matching circuit connected to the unbalanced line,
   wherein a length of a strip line in the balun portion is shorter than a fundamental length of $\lambda/4$ to shift a center frequency to higher band side, and the shifted portion is compensated with an expansion to lower band side by the matching circuit.

4. A balun device, comprising:
   a balun portion comprising a balanced line and an unbalanced line; and
   a matching circuit connected to the unbalanced line,
   wherein the balun portion comprises a capacitor and an inductor elements that give a resonant frequency lower than a resonant frequency coincided with an applied center frequency, to shift a center frequency to higher band side, and the shifted portion is compensated with an expansion to lower band side by the matching circuit.

5. A balun device, comprising:
   a balun portion comprising a balanced line and an unbalanced line; and
   a matching circuit connected to the unbalanced line,
   wherein the matching circuit has an improved reflective property compared to that of the balun portion, in vicinity of cut-off frequency at a lower band side.

6. A balun device, comprising:
   a balun portion comprising a balanced line and an unbalanced line; and
   a matching circuit connected to the balanced line,
   wherein a length of a strip line in the balun portion is shorter than $\lambda/4$ which is a fundamental length, to shift a center frequency to higher band side, and the shifted portion is compensated with an expansion to lower band side by the matching circuit.

7. A balun device, comprising:
   a balun portion comprising a balanced line and an unbalanced line; and
   a matching circuit connected to the balanced line,
   wherein the balun portion comprises a capacitor and an inductor element that give a resonant frequency lower than a resonant frequency coincided with an applied center frequency, to shift a center frequency to higher band side, and the shifted portion is compensated with an expansion to lower band side by the matching circuit.

8. A balun device, comprising:
   a balun portion comprising a balanced line and an unbalanced line; and
   a matching circuit connected to the balanced line,
   wherein the matching circuit has an improved reflective property compared to that of the balun portion, in vicinity of cut-off frequency at a lower band side.

9. A balun device, comprising:
   a balun portion comprising a balanced line and an unbalanced line; and
   a high-pass filtering matching circuit connected to the balanced line, unbalanced line, or both,
   wherein the balun portion is configured to shift a center frequency to higher band side, and the shifted portion is compensated with an expansion to lower band side by the matching circuit.

10. The balun device as claimed in claim 9, wherein the high-pass filtering matching circuit comprises a first capacitor connected in series to the unbalanced line and a first inductor connected in parallel to the unbalanced line, and wherein the first capacitor is connected at a side closer to the balun portion than the first inductor.

* * * * *